(12) United States Patent
Prinz et al.

(10) Patent No.: US 7,732,278 B2
(45) Date of Patent: Jun. 8, 2010

(54) SPLIT GATE MEMORY CELL AND METHOD THEREFOR

(75) Inventors: Erwin J. Prinz, Austin, TX (US); Michael A. Sadd, Austin, TX (US); Robert F. Steimle, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/254,294

(22) Filed: Oct. 20, 2008

(65) Prior Publication Data

US 2009/0042349 A1    Feb. 12, 2009

Related U.S. Application Data

(62) Division of application No. 11/240,240, filed on Sep. 30, 2005, now Pat. No. 7,456,465.

(51) Int. Cl.
  *H01L 21/336* (2006.01)
(52) U.S. Cl. ................ 438/257; 257/316; 257/E21.681
(58) Field of Classification Search .................. 438/258, 438/266, 201, 257, 277, 288; 257/316, E21.681, 257/E21.18
  See application file for complete search history.

(56) References Cited

U.S. PATENT DOCUMENTS

| | | | |
|---|---|---|---|
| 4,173,766 A | 11/1979 | Hayes | |
| 4,608,585 A | 8/1986 | Keshtbod | |
| 5,408,115 A | 4/1995 | Chang | |
| 5,585,293 A | 12/1996 | Sharma et al. | |
| 5,824,584 A | 10/1998 | Chen et al. | |
| 5,969,383 A | 10/1999 | Chang et al. | |
| 5,986,941 A | 11/1999 | Pang et al. | |
| 6,018,178 A * | 1/2000 | Sung | 257/316 |
| 6,344,403 B1 | 2/2002 | Madhukar et al. | |
| 6,713,812 B1 | 3/2004 | Hoefler et al. | |
| 6,751,125 B2 | 6/2004 | Prinz et al. | |
| 6,816,414 B1 | 11/2004 | Prinz | |
| 6,887,758 B2 | 5/2005 | Chindalore et al. | |
| 6,911,691 B2 | 6/2005 | Tomiie et al. | |
| 7,259,423 B2 * | 8/2007 | Min et al. | 257/324 |
| 7,364,969 B2 | 4/2008 | Prinz et al. | |
| 2004/0183122 A1 | 9/2004 | Mine et al. | |
| 2004/0238878 A1 | 12/2004 | Sato et al. | |

(Continued)

OTHER PUBLICATIONS

Chang et al; "A New SONOS Memory Using Source-Side Injection for Programming"; IEEE Electron Device Letters, vol. 19, No. 7, Jul. 1998.

(Continued)

*Primary Examiner*—Quoc D Hoang
(74) *Attorney, Agent, or Firm*—James L. Clingan, Jr.; David G. Dolezal

(57) ABSTRACT

A split gate memory cell has a select gate, a control gate, and a charge storage structure. The select gate includes a first portion located over the control gate and a second portion not located over the control gate. In one example, the first portion of the select gate has a sidewall aligned with a sidewall of the control gate and aligned with a sidewall of the charge storage structure. In one example, the control gate has a p-type conductivity. In one example, the gate can be programmed by a hot carrier injection operation and can be erased by a tunneling operation.

12 Claims, 5 Drawing Sheets

U.S. PATENT DOCUMENTS

2005/0191808 A1    9/2005    Steimle et al.

OTHER PUBLICATIONS

Restriction Requirement on Parent U.S. Appl. No. 11/240240 mailed Dec. 28, 2007.

Office Action on Parent U.S. Appl. No. 11/240240 mailed Feb. 26, 2008.

Notice of Allowance on Parent U.S. Appl. No. 11/240240 mailed Sep. 26, 2008.

* cited by examiner

SPLIT GATE MEMORY CELL AND METHOD THEREFOR

FIELD OF THE INVENTION

This invention relates to integrated circuits, and more particularly, to a method of making non-volatile memory (NVM) cells.

BACKGROUND OF THE INVENTION

Split gate memory cells have found a particular use in non-volatile memories (NVMs) that have many applications and the applications are continuing for the foreseeable future. The methods for program and erase have been the subject of continuous study with a view to achieving desired or improved program and erase times with the lower voltages being used. Program and erase must still provide a sufficient differential between states for reading. Generally the bigger the difference the more effective and reliable is the reading of the state. Issues such as read disturb also continue to be concerns and must be taken into account in any design. Further there is the continuing improvement in lithography and processes so that dimensions continue to reduce, and the NVM cells should be designed to take advantage of the reduced dimensions. A variety of different techniques have been developed to address these issues, but there is a continuing desire for further improvement.

Thus, there is a need for a technique for improving on one or more of the issues described above.

BRIEF DESCRIPTION OF THE DRAWINGS

The foregoing and further and more specific objects and advantages of the invention will become readily apparent to those skilled in the art from the following detailed description of a preferred embodiment thereof taken in conjunction with the following drawings.

DETAILED DESCRIPTION OF THE INVENTION

In one aspect a split gate memory cell that is an N channel transistor is made by a process in which a control gate, which is preferably p+, and a select gate are etched on one side at the same time. This provides for self alignment of the select gate and control gate on that side that has the effect of protecting the control gate from the subsequent n+ implant for the source/drains as well as providing a low mask count. This is better understood by reference to the drawings and the following description.

Figure 1:
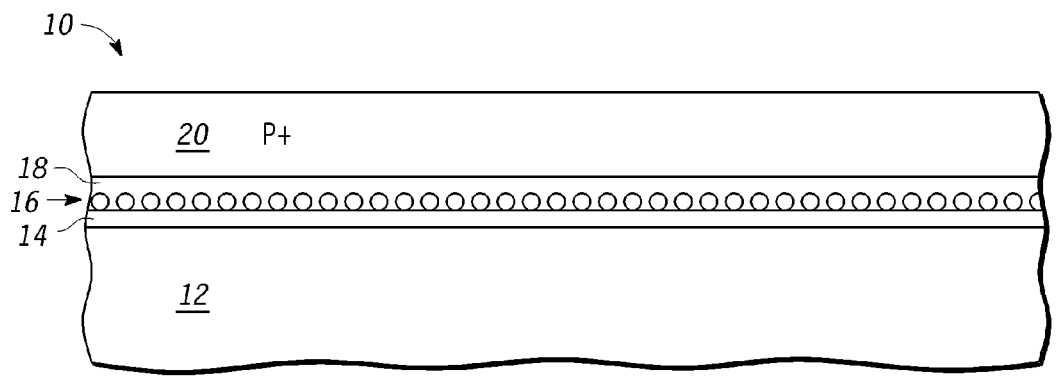
FIG. 1 is a cross section of a semiconductor device at a stage in a process that is according to an embodiment of the invention.

Shown in FIG. 1 is a semiconductor device structure 10 having a semiconductor substrate 12, a dielectric layer 14 on semiconductor substrate 12, a nanocrystal layer 16 on dielectric layer 14, a dielectric layer 18 on and surrounding nanocrystal layer 16, and a polysilicon layer 20 on dielectric layer 18. Dielectric layer 14 is preferably silicon oxide that is grown and is about 50 Angstroms in thickness. Dielectric layer 14 could also be a different material and could be deposited. Nanocrystal layer 16 is preferably a layer of silicon nanocrystals that are in the range of 50-150 Angstroms in diameter. The nanocrystals do not have to be silicon and could be another material. Further, another storage layer type could replace nanocrystal layer 16. Dielectric layer 18 is preferably silicon oxide that fills in among the nanocrystals of nanocrystal layer 16 and is about 100 Angstroms thick above nanocrystal layer 16. In this example, the semiconductor material is preferably silicon but could be another material such as silicon germanium or gallium arsenide. Semiconductor substrate 12 is shown as bulk silicon but could be another type of substrate such as SOI. Polysilicon layer 20 is doped to p+. The p+ doping is preferably by in situ doping but could be by another means such as implanting.

Figure 2:
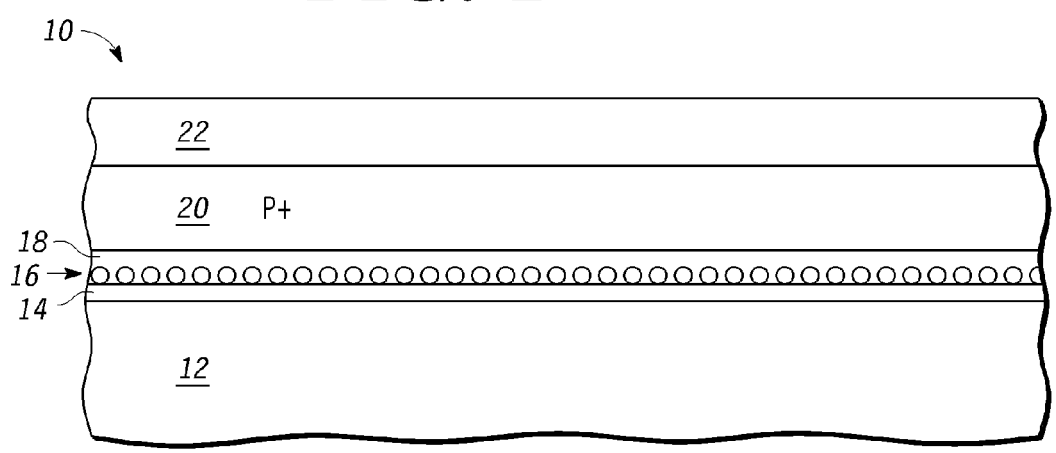
FIG. 2 is a cross section of the semiconductor device of FIG. 1 at a stage in the process subsequent to that shown in FIG. 1.

Shown in FIG. 2 is semiconductor device structure 10 after formation of a dielectric layer 22 which is preferably silicon oxide that is deposited to about 200 Angstroms thick. This could be another material or composite of materials such as oxide-nitride-oxide.

Figure 3:
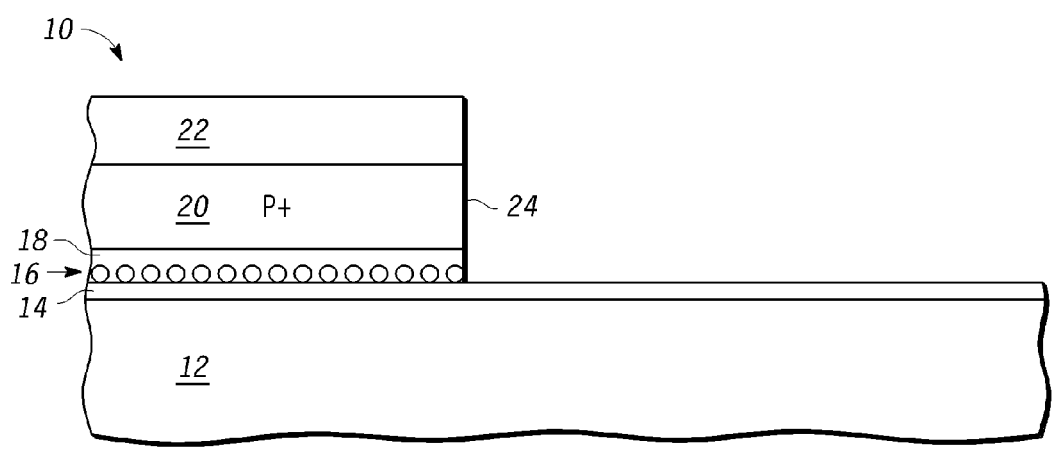
FIG. 3 is a cross section of the semiconductor at a stage in the process subsequent to that shown in FIG. 2.

Shown in FIG. 3 is semiconductor device 10 after a patterned etch of dielectric layers 22 and 18, nanocrystal layer 16, and polysilicon layer 20. This etch, which is preferably a dry etch, leaves a sidewall 24 on polysilicon layer 20. The pattern is preferably achieved using photoresist that is patterned by a lithographic exposure, which is the preferable approach in all of the patterned etches described hereafter.

Figure 4:
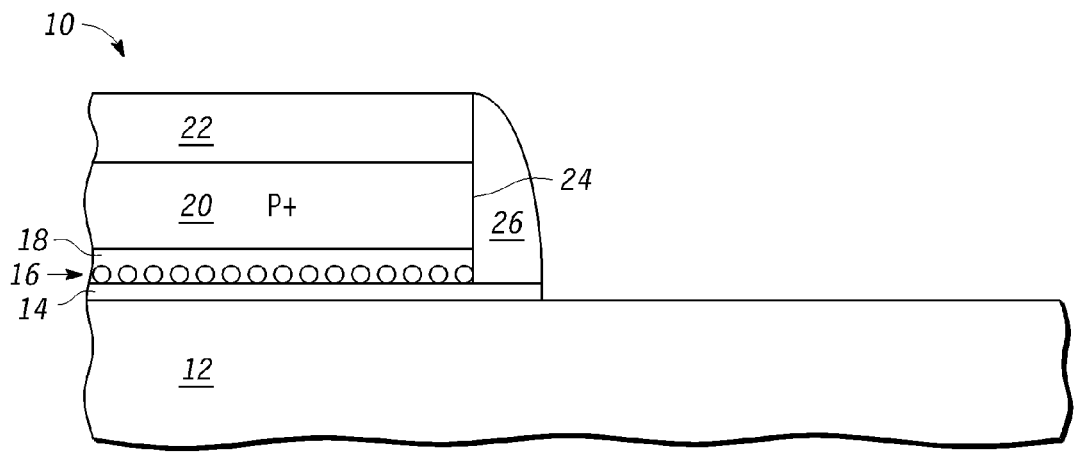
FIG. 4 is a cross section of the semiconductor at a stage in the process subsequent to that shown in FIG. 3.

Shown in FIG. 4 is semiconductor device 10 after formation of a sidewall spacer 26 along sidewall 24. Sidewall spacer 26 is preferably silicon oxide. Other dielectric materials may also be effective. In this case sidewall spacer is preferably about 150 Angstroms thick along sidewall 24. Dielectric layer 14 has an exposed portion that is removed by a wet etch. The exposed portion was that portion not covered by sidewall spacer 26 and the remaining portion of polysilicon layer 20. This results in an exposed portion of substrate 12.

Figure 5:
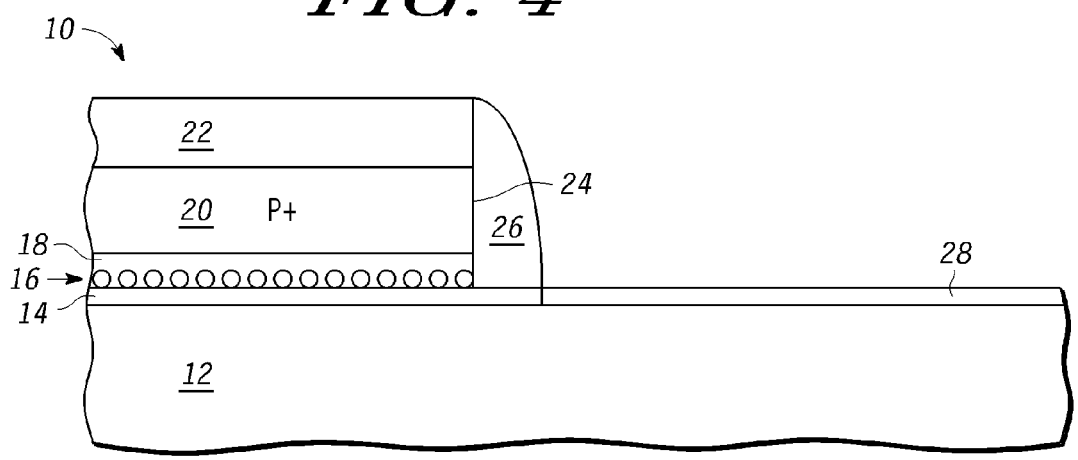
FIG. 5 is a cross section of the semiconductor device at a stage in the process subsequent to that shown in FIG. 4.

Shown in FIG. 5 is semiconductor device 10 after growing a gate dielectric layer 28 on the exposed portion of substrate 12. Gate dielectric 28 is preferably silicon oxide but could alternatively be another material such as a deposited high-k dielectric such as hafnium oxide. As silicon oxide, gate dielectric 28 is preferably about 50 Angstroms thick. A deposited high-k dielectric for gate dielectric 28 would extend over sidewall spacer 26 and dielectric layer 22.

Figure 6:
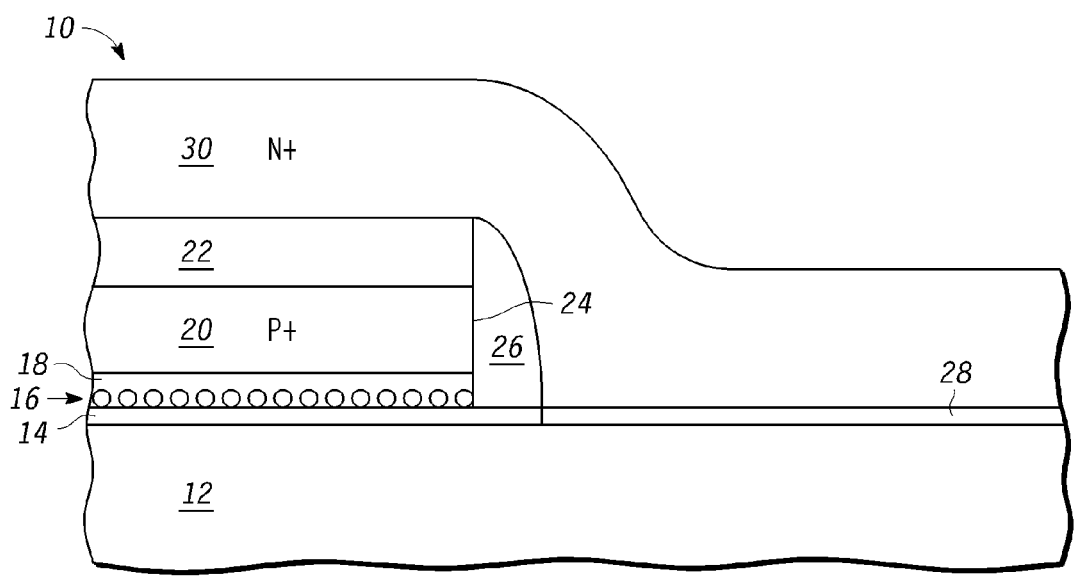
FIG. 6 is a cross section of the semiconductor device at a stage in the process subsequent to that shown in FIG. 5.

Shown in FIG. 6 is semiconductor device 10 after formation of a conductive layer 30. Conductive layer 30 is preferably polysilicon doped to n+ but could be another conductive material. For example, a metal useful as a gate for an n channel transistor would be an effective alternative.

Figure 7:
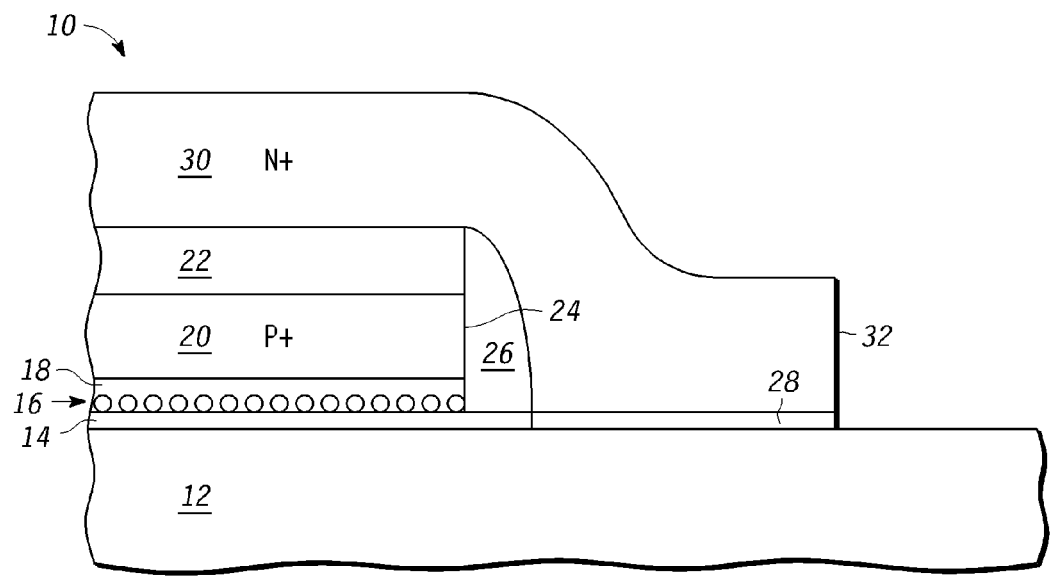
FIG. 7 is a cross section of the semiconductor device structure of FIG. 6 at a subsequent stage in the process.

Shown in FIG. 7 is semiconductor device 10 after a patterned etch of conductive layer 30 which exposes a sidewall 32 of conductive layer 30 that is spaced away from sidewall spacer 26 and sidewall 24 of polysilicon layer 20. This exposes a portion of gate dielectric 28 that is also removed.

Figure 8:
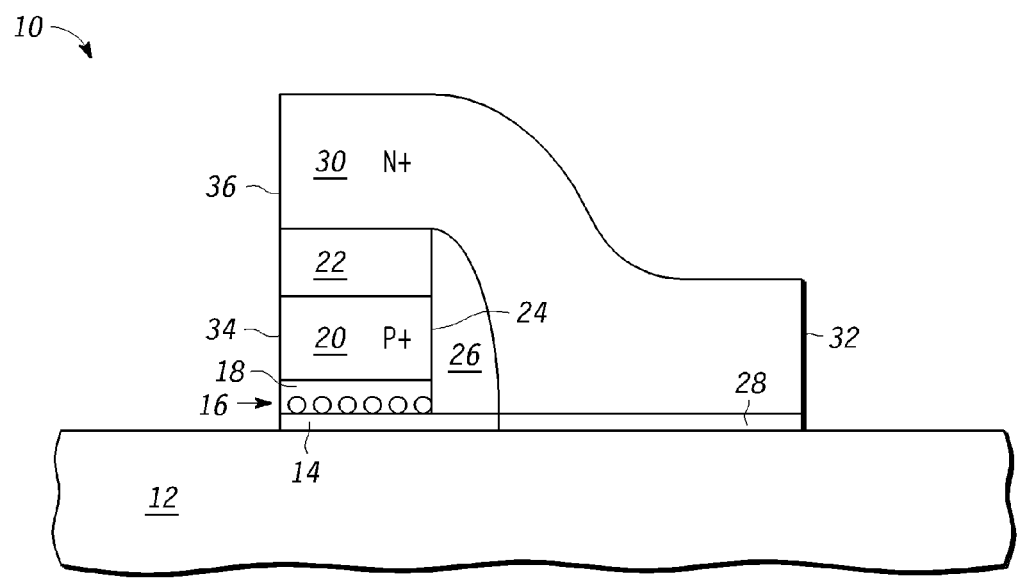
FIG. 8 is a cross section of the semiconductor device structure of FIG. 7 at a subsequent stage in the process.

Shown in FIG. 8 is semiconductor device 10 after a patterned etch through conductive layer 30, dielectric layer 22, polysilicon layer 20, dielectric layers 14 and 18, and nanocrystal layer 16 to expose a sidewall 36 of conductive layer 30 and a sidewall 34 of polysilicon layer 20. As an alternative, this etch shown in FIG. 8 can be combined with the etch shown in FIG. 7 to reduce the mask count by one and to reduce alignment issues. By using two masks instead of just one, the issues with exposing the substrate during the etch of polysilicon layer 20 is avoided. Another alternative is to reverse the order of the etches of FIGS. 7 and 8.

Figure 9:
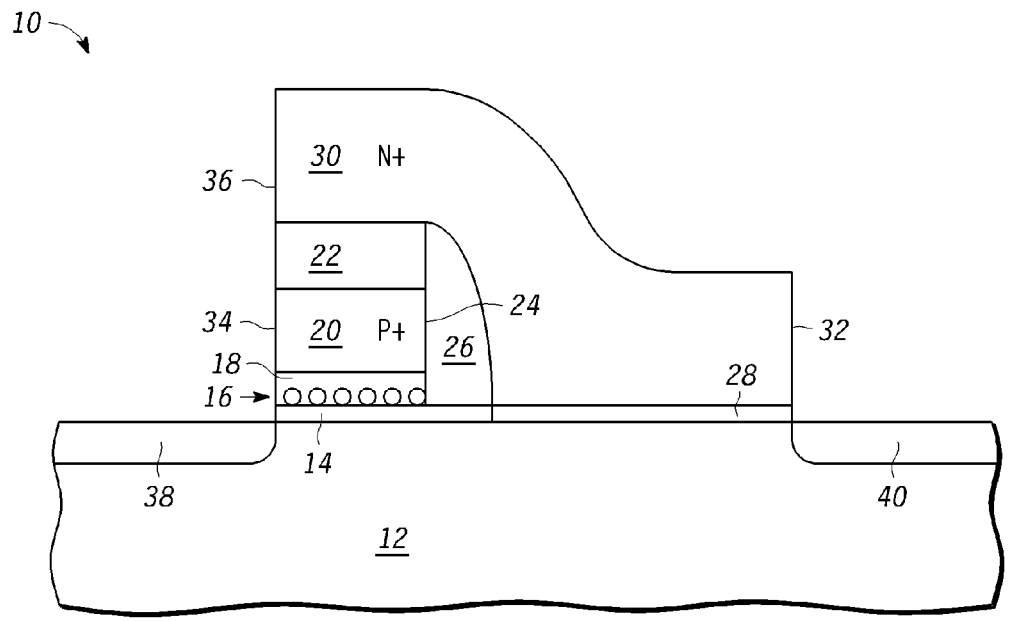
FIG. 9 is a cross section of the semiconductor device structure of FIG. 8 at a subsequent stage in the process.

Shown in FIG. 9 is a semiconductor device structure 10 after an extension implant of n-type dopants, preferably phosphorus to form extension region 38 aligned to sidewall 34 and extension region 40 aligned to sidewall 32. The alignment may not be perfect due to angling of the implant. Another known n-type dopant is arsenic that may be used. Thus, extensions 38 and 40 are separated by a distance set by the distance between sidewalls 34 and 32.

Figure 10:
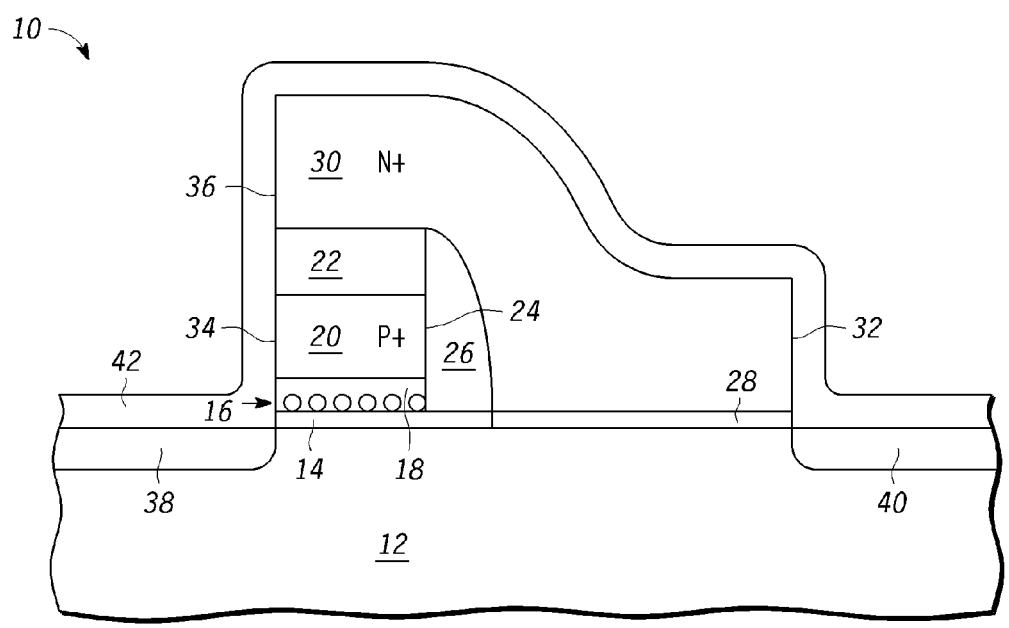
FIG. 10 is a cross section of the semiconductor device structure of FIG. 9 at a subsequent stage in the process.

Shown in FIG. 10 is semiconductor device structure 10 after forming liner 42 that is a dielectric material, preferably silicon oxide that covers extension 38, the sidewalls of dielectric layers 14 and 18, nanocrystal layer 16, sidewall 34, the sidewall of dielectric layer 28, conductive layer 30, and extension 40.

Figure 11:
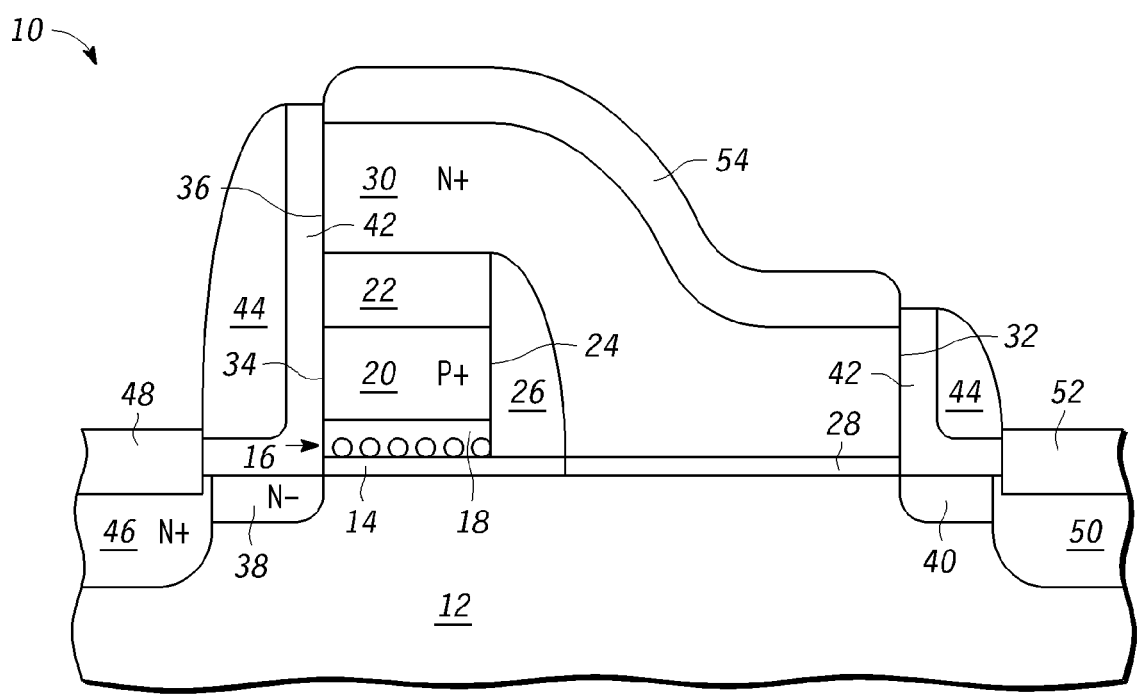
FIG. 11 is a cross section of the semiconductor device structure of FIG. 10 at a subsequent stage in the process.

Shown in FIG. 11 is semiconductor device structure 10 after forming sidewall spacer 44 around conductive layer 30 and adjoining liner 42. The portion of sidewall spacer at sidewall 32 is not high as the portion on sidewalls 34 and 36 because the combination of sidewalls 34 and 36 along with the sidewalls of the other layers on that side is significantly higher than just sidewall 32. Thus the conformal layer that is etched to form sidewall spacer 44 is much higher on the side having sidewalls 34 and 36 than the side having sidewall 32. After sidewall spacer 44 is formed, liner 42 is removed where exposed and an n+ implant is performed to form contact regions 46 and 50 in extensions 38 and 40, respectively. After the implant, a silicidation step is performed. Silicide regions 48 and 52 are formed directly on contact regions 46 and 50, respectively. Silicide region 54 is formed directly on conductive layer 30. Semiconductor device structure 10 as shown in FIG. 11 is thus an n channel, split gate, NVM cell in which conductive layer 30 is the select gate, polysilicon layer 20 is a control gate, extension region 38 is a source for reading and a drain for programming, and extension region 40 is a drain for reading and a source for programming.

Semiconductor substrate 12 has a doping gradient that has a p-type dopant, for example indium, deep in substrate 12 and an n-type dopant, for example phosphorus, near the surface. This type of arrangement shifts the threshold voltage of the NVM cell in the negative direction relative to implanting only p-type dopants, while greatly reducing the short channel effects under the control gate. This allows for having an erased state that may have a negative threshold voltage and a programmed state that is reduced in magnitude. The advantage of this lower threshold voltage is that the voltage applied to polysilicon gate 20 during read may be lowered, so that that the state of nanocrystal layer 16 is disturbed less than it would be with a higher read voltage. To prevent leakage through unselected cells caused by the lowered threshold voltage during a read mode for using the NVM cell of FIG. 11, a negative voltage is applied to conductive layer 30 when deselected. For selection, a voltage such as one volt is applied to conductive layer 50 and thus extension 40. During the read mode, polysilicon layer 20 is biased at one volt, and layers 48, 46, 38, and well region of substrate 12 are placed at ground. The well region of substrate 12 may be isolated from the rest of the substrate by an n-type dopant implanted below the p-type dopant.

Programming is achieved in conventional source side injection that is commonly employed in split gate configurations. This is achieved by applying ground to silicide 52 and thus extension 40 and similarly a positive voltage, such as 4 volts, to extension 38 through silicide 48. Conductive layer 30 is at two to three tenths of a volt above its threshold voltage to establish a bias current of about 5 microamps, and control gate is much higher at between 6 to 9 volts to accelerate the carriers in a vertical direction toward the nanocrystals. This is a relatively normal bias condition for source side injection.

Erase, however, is performed by tunneling. For tunneling, a negative bias between polysilicon layer 20 and substrate 12 is established sufficient for tunneling to occur between the nanocrystals and substrate 12. For example, a negative 6 volts is applied to polysilicon layer 20, a positive 6 volts is applied to regions 12, 38, 46, 48, 40, 50, and 52, and a positive 5 volts is applied to conductive layer 30. A benefit of tunneling is that the storage medium is substantially uniformly erased even if the programming levels are uneven. Although source side injection is beneficial for improving programming time, it does result in more carriers being in one location compared to another. A known alternative to erasing by tunneling is to erase by injection of hot holes from the source side which would be from extension 38 in this case. The location at which holes are injected, however, does not necessarily match the location at which electrons are programmed. Thus, it is not assured that the NVM cell returns to the same state after each sequence of programming and erase. This uncertainty is undesirable. With tunneling, however, this is much less likely to happen. With tunneling, the applied erase bias is effective in achieving the same erase condition at each location in nanocrystal layer 16 even if the initial programmed charge varied from location to location. Once the erase condition is reached, the carriers do not continue to be removed even while the erase bias is still applied.

Another benefit is achieved using a p+ gate for the control gate. A p+ gate has a deeper Fermi level for electrons than an n+ gate so that there is a larger barrier to inject electrons at the interface of polysilicon layer 20 and dielectric layer 18. During erase it is therefore more difficult for electrons to move from the control gate to the nanocrystals. One of the difficulties with erasing is that while electrons are being removed from the nanocrystals by moving them to the substrate, electrons are also moving from the control gate to the nanocrystals. Erasing stops when the flows equalize. If the flow of electrons from the control gate can be reduced, then a higher degree of erasure can be achieved. Thus, with the reduced electron flow from the control gate during erase, the NVM cell has a lower threshold voltage than it would if it had an n-type gate. The effect then is that there is more separation between threshold voltage for the erased and programmed states. This results in an improvement in one or more of read time, endurance, and data retention. The p+ gate is readily achievable due to polysilicon layer 20 being covered by conductive layer 30 when regions 38, 40, 46, and 50 are implanted.

Another benefit of the approach described for this NVM cell is that regions 38, 40, 46, and 50 do not require an additional mask when they are formed by implanting compared to the peripheral transistors because the n+ implant from the low voltage or the input/output transistors can be utilized without further optimization. Also space is saved in the size of the NVM cell by having conductive layer 30 aligned with sidewall 34 rather than extending past sidewall 34.

Various other changes and modifications to the embodiments herein chosen for purposes of illustration will readily occur to those skilled in the art. For example, even though the materials and alternatives thereof were described, further alternatives may also be used. To the extent that such modifications and variations do not depart from the spirit of the invention, they are intended to be included within the scope thereof which is assessed only by a fair interpretation of the following claims.

The invention claimed is:

1. A method for forming a split gate memory cell, comprising:
   forming a charge storage layer comprising nanocrystals over a substrate;
   forming a layer of control gate material over the charge storage layer, wherein the control gate material is formed of a semiconductor material that is doped to p type;
   patterning the layer of control gate material, wherein the patterning defines a first sidewall of a structure of the layer of control gate material;
   forming a layer of select gate material over the substrate and over the structure of the layer of control gate material after the patterning the layer of control gate material, wherein the select gate material is formed of semiconductor material that is doped to n type; and
   patterning the layer of select gate material and the structure of the layer of control gate material to define a stack sidewall, the stack sidewall including a first sidewall of a structure of the layer of select gate material and a second sidewall of the structure of the layer of control gate material, wherein the first sidewall of the structure of the layer of control gate material is an opposite sidewall to the second sidewall of the structure of the layer of control gate material.

2. A method of claim 1 further comprising:
   patterning the layer of select gate material, the patterning defining a second sidewall of the structure of the layer of select gate material, the second sidewall of the structure of the layer of select gate material is an opposite sidewall to the first sidewall of the of the structure of the layer of select gate material.

3. The method of claim 2 wherein the patterning the layer of select gate material is performed before the patterning the layer of select gate material and the structure of the layer of control gate material to define a stack sidewall.

4. The method of claim 2, further comprising forming a first source/drain aligned to the first sidewall of a structure of the layer of select gate material and forming a second source/drain aligned to the second sidewall of the structure of the layer of select gate material.

5. The method of claim 2, further comprising forming, prior to the step of forming the layer of select gate material, forming a sidewall spacer on the first sidewall of a structure of the layer of control gate material.

6. The method of claim 5, further comprising forming a first source/drain aligned to the first sidewall of a structure of the layer of select gate material and forming a second source/drain aligned to the second sidewall of the structure of the layer of select gate material.

7. The method of claim 1 further comprising:
   forming a layer of charge storage material over the substrate, wherein the layer of control gate material is formed over the layer of charge storage material.

8. The method of claim 7 wherein:
   the patterning the layer of control gate material further defines a first sidewall of a charge storage structure of the layer of charge storage material; and
   the patterning the layer of select gate material and the structure of the layer of control gate material to define a stack sidewall further includes patterning the layer of charge storage material, wherein the stack sidewall includes a second sidewall of the charge storage structure, the second sidewall of the charge storage structure is an opposite sidewall to the first sidewall of the charge storage structure.

9. The method of claim 1, wherein the step of forming the layer of control gate material is further characterized by in-situ doping the control gate material to p-type.

10. The method of claim 1, wherein the step of forming the layer of control gate material is further characterized by implanting the layer to cause the control gate material to be p-type.

11. The method of claim 1, further comprising forming source/drain regions that are n-type.

12. The method of claim 1, further comprising forming, prior to the step of forming the layer of select gate material, forming a sidewall spacer on the first sidewall of a structure of the layer of control gate material.

* * * * *